United States Patent [19]
Yeh

[11] Patent Number: 6,133,055
[45] Date of Patent: Oct. 17, 2000

[54] METHOD OF FORMING A TEST KEY ARCHITECTURE

[75] Inventor: Meng-Lin Yeh, Taipei, Taiwan

[73] Assignee: United Semiconductor Corp, Hsinchu, Taiwan

[21] Appl. No.: 09/316,196

[22] Filed: May 21, 1999

[51] Int. Cl.$^7$ .................................................. H01L 21/66
[52] U.S. Cl. .............................................. 438/18; 438/238
[58] Field of Search ................................ 438/17, 18, 221, 438/238, 401

[56] References Cited

U.S. PATENT DOCUMENTS

| | | | |
|---|---|---|---|
| 5,426,065 | 6/1995 | Chan et al. | 438/238 |
| 5,773,317 | 6/1998 | Wu et al. | 438/18 |
| 5,976,901 | 11/1999 | Igel | 438/18 |

*Primary Examiner*—Chandra Chaudhari
*Attorney, Agent, or Firm*—J. C. Patents; Jiawei Huang

[57] ABSTRACT

A method of forming a test key architecture on a silicon wafer. The method includes forming trench isolation regions between a source region and a drain region. Thereafter, a plurality of active regions are formed in parallel above the trench isolation regions such that the smallest possible width for each active region is chosen to reduce overall area occupation and increase the number of test keys. Next, a long pass gate is formed above the trench isolation regions, crossing and covering the parallel-connected active regions. Consequently, the effect due to stress-induced defect and the probability of leakage current due to parasitic device effect are greatly increased.

5 Claims, 4 Drawing Sheets

METHOD OF FORMING A TEST KEY ARCHITECTURE

BACKGROUND OF THE INVENTION

1. Field of Invention

The present invention relates to a test key architecture. More particularly, the present invention relates to a test key architecture for evaluating the severity of stress-induced defects due to the formation of shallow trench isolation (STI) around integrated circuit devices and parasitic device effect.

2. Description of Related Art

Shallow trench isolation (STI) is a commonly used device isolation technique that is currently employed in the fabrication of CMOS memories. STI structures are formed by first carrying out an anisotropic dry etching operation to form a trench between a PMOS and an NMOS, and then filling in silicon dioxide (a non-conductive material) and polysilicon (a semiconductor material). The depth of the trench is generally deeper than the depth of the CMOS. Hence, the PMOS and NMOS within a CMOS can be successfully isolated so that latching between the two can be prevented, and the original level of integration for the CMOS can be maintained.

However, the formation of STI structures in static random access memory (SRAM) often leads to the occurrence of standby current failure. In particular, stress-induced defects due to the formation of STI structure and leakage current due to parasitic device effect are the major problems in SRAM/STI fabrication.

FIGS. 1A through 1C are diagrams illustrating the reason and points of origin of the parasitic device effect in a device. As shown in FIG. 1A, silicon dioxide 12 is deposited into the trench for forming an STI structure. Since two different types of materials (silicon substrate 10 and silicon dioxide 12) are used to form the trench, stresses 14 will be created at their junctions. Consequently, the upper surface 16 of the silicon dioxide layer 12 will form a slightly recessed cavity.

Next, as shown in FIG. 1B, a gate oxide layer and a polysilicon layer are deposited sequentially over the silicon substrate 10 to form a composite layer 18 (thereby forming an active region). Due to the creation of a geometric structure (arc-shaped structure) relative to point 20 inside the silicon substrate 10 around the STI construction, an electric field will tend to concentrate around that area.

FIG. 1C is a top view of the device and surrounding STI structure of FIG. 1B. As shown in FIG. 1C, a source region 22, a drain region 24 and a channel 26 between the source and the drain region are formed above the active region. The hatched areas represent the locations where the STI structures are formed. The internal point 20 of FIG. 1B becomes a line running along the intersection between the channel 26 and the STI structure in FIG. 1C, for example, lines 28 and 30. These resulting structures will bring out what is known as the parasitic device effect. When the device is operating in an off mode, a rather large leakage current appears.

FIG. 2 is a diagram illustrating the process of producing a stress-induced leakage current. In FIG. 2, parts that are the same as in FIG. 1C are labeled identically. As shown in FIG. 2, the long pass gate 32 covers a portion of the STI/active region. Due to the stress 34 that pulls in opposite direction, leakage cracks 36 induced by the stress will be created in areas between the channel 26 above the active region and the long pass gate 32. Consequently, a short-circuiting leakage current may be generated.

To illustrate the effect produced by cracks 36 in FIG. 2 better, a diagram showing the I-V characteristic curve of an operating device is drawn in FIG. 3. In FIG. 3, the horizontal axis represents the gate voltage $V_G$ (unit is Volt) while the vertical axis represents the drain current $I_D$ (unit is Amp). The solid line in FIG. 3 represents an ideal state. In the presence of stress-induced leakage current, off mode current (front portion of the curve in FIG. 3) will shoot up considerably as indicated by the dash line portion. The off mode current in FIG. 3 is shown to increase from the original $10^{-10}$ (A) to around $10^{-7}$ (A). Such an increase in off mode current will have a definite effect on the actual operation of the device.

Conventional test key architecture for measuring the effect of stress-induced defect and leakage current due to parasitic device effect usually includes an SRAM memory cell array and a number of MOS devices. FIG. 4 is a conventional test key architecture for measuring stress-induced leakage current and parasitic device effect.

As shown in FIG. 4, the test key architecture includes six transistors (T1~T6) that connect with bit line B and word line W, respectively. When a voltage is applied to the bit line and the word line W, leakage current Ig can be measured and analyzed. Ultimately, whether leakage current is due to stress defect or parasitic device effect can be determined. However, probability of having a leakage current is low. Therefore, an SRAM memory cell array having at least several thousand bits as well as many MOS device is needed in practice. Since these test keys occupy a large area, a difficult decision of whether to opt for timing efficiency or spatial efficiency must be made.

In light of the foregoing, there is a need to provide an improved test key architecture.

SUMMARY OF THE INVENTION

Accordingly, the present invention is to provide a parallel connected test key architecture that has the smallest area occupation and the largest number of test keys. Moreover, probability of leakage current due to stress-induced defect and parasitic device effect is increased so that further analysis can be conducted without wasting too much area.

To achieve these and other advantages and in accordance with the purpose of the invention, as embodied and broadly described herein, the invention provides a test key architecture on a silicon chip. The test key architecture includes forming a source region, a drain region and a trench isolation region on a silicon chip such that the trench isolation region is located between the source region and the drain region. Next, a plurality of parallel-connected active regions is formed over the trench isolation region, and then their sides are connected to the source region and the drain region respectively. Thereafter, a long pass gate is formed over the trench isolation region, crossing over and covering the parallel-connected active regions. Finally, different voltages are applied to the source region, the drain region and the long pass gate for measuring the leakage current due to stress induced defect and the parasitic device effect.

According to this invention, the long pass gate can be configured into an S-shape or a W-shape for effecting the measurement. Furthermore, width of the active region and the width of the long pass gate should be reduced as much as possible so that the number of test keys can be increased within a fixed area. Hence, effects due to stress-induced defect and parasitic device effect are more easily measured. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
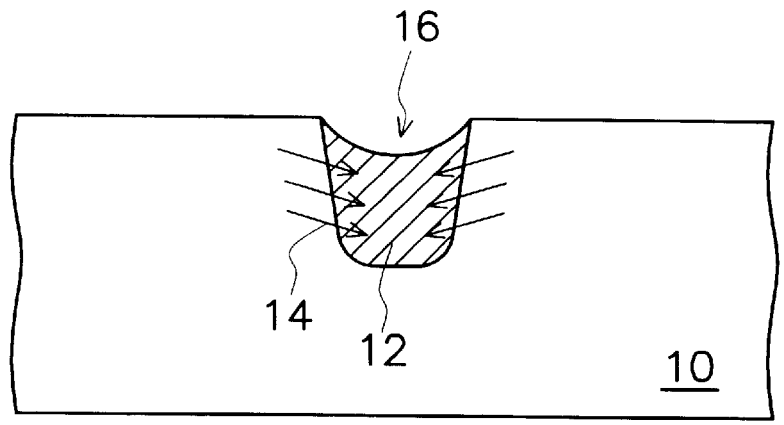
FIGS. 1A, 1B and 1C are diagrams illustrating the reason and points of origin of the parasitic device effect in a device.
Figure 1B:
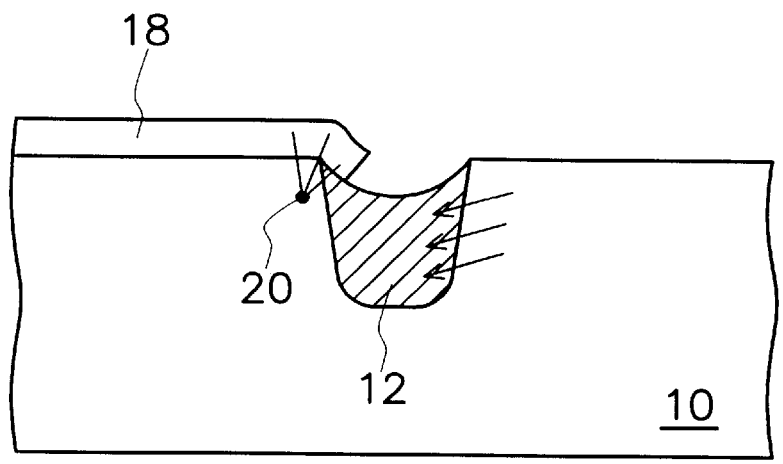
Figure 1C:
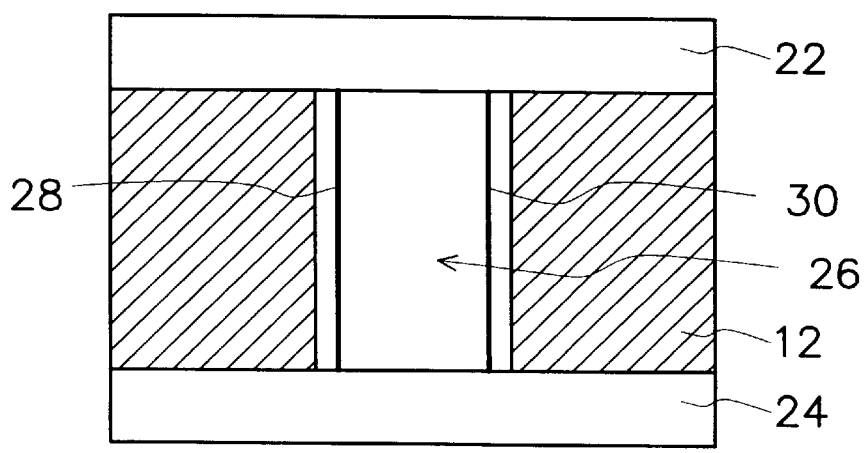
Figure 2:
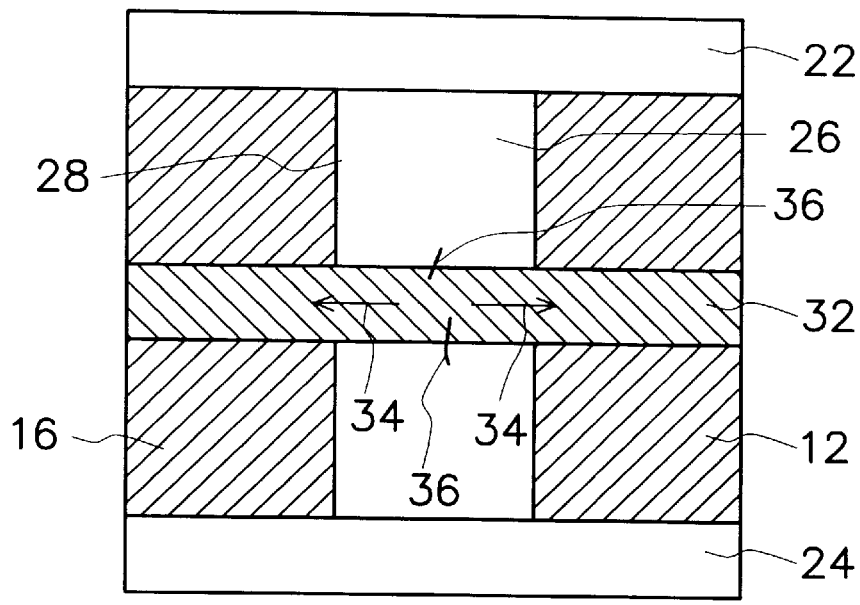
FIG. 2 is a diagram illustrating the process of producing a stress-induced leakage current.
Figure 3:
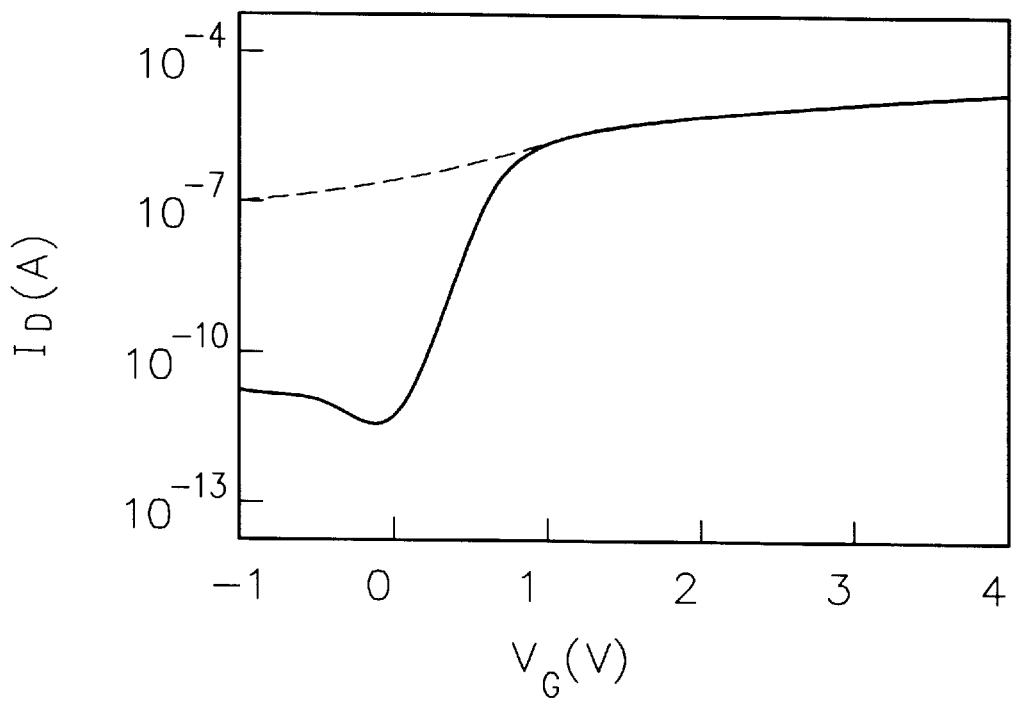
FIG. 3 is a diagram showing the I-V characteristic curve of an operating device.
Figure 4:
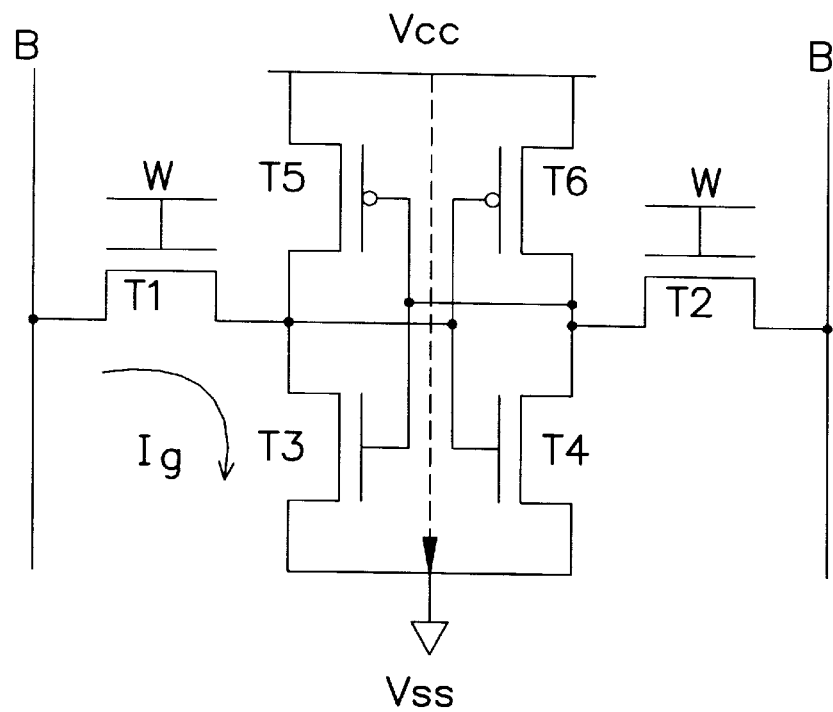
FIG. 4 is a conventional test key architecture for measuring stress-induced leakage current and parasitic device effect.

Reference will now be made in detail to the present preferred embodiments of the invention, examples of which are illustrated in the accompanying drawings. Wherever possible, the same reference numbers are used in the drawings and the description to refer to the same or like parts.

Figure 5:
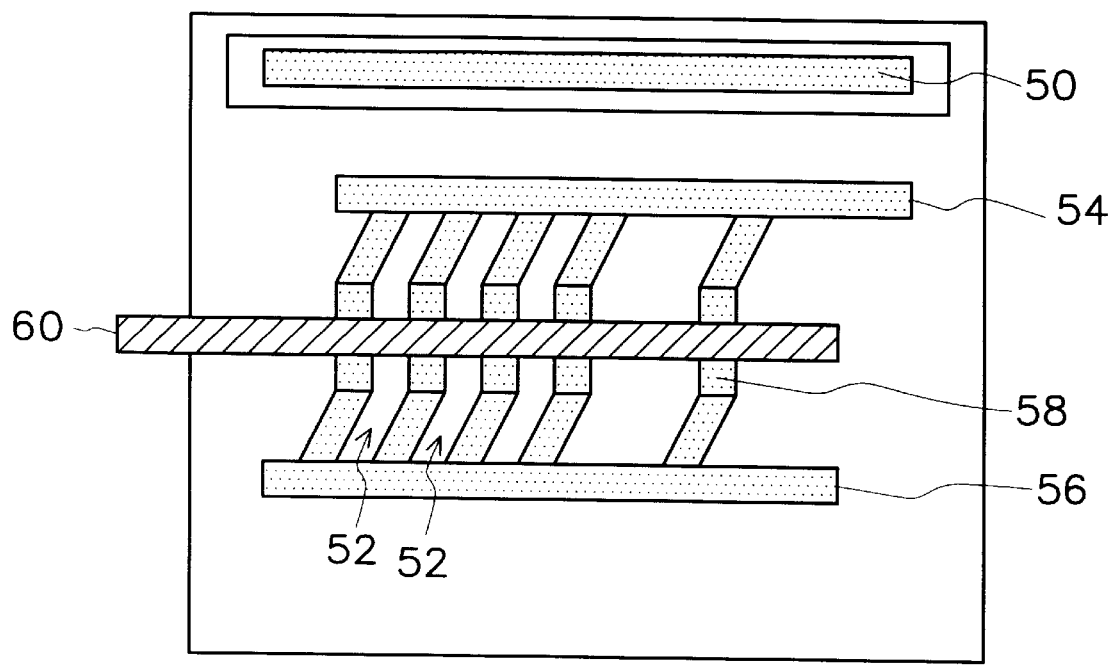
FIG. 5 is a test key architecture according to one preferred embodiment of this invention.

FIG. 5 is a test key architecture according to one preferred embodiment of this invention.

As shown in FIG. 5, a substrate region 50, a source region 56, a drain region 54 and a plurality of active regions 58 are formed on a chip. The source region 56 and the drain region 54 are located on each side of the plurality of active regions 58 so that the two terminals of each of the active region 58 are connected. The plurality of active regions 58 are isolated from each other through a number of trench isolation regions 52. Consequently, there will be little interference between neighboring devices within an active region 58. All the active regions 58 are connected in parallel. In addition the smallest possible width is used to form each active region 58 so that the largest number of parallel-connected active regions 58 and hence test keys can be packed within a given area. Due to the geometry (arc-shaped structure) in the neighborhood of an STI structure somewhere between an active region 58 and a trench isolation region 52, an electric field concentrates there. Therefore, as the number of test keys is increased, probability of producing a leakage current due to parasitic device effect is greatly increased.

Next, a long pass gate 60 is formed over the trench isolation regions 52 and the active regions 58. The long pass gate 60 not only cuts across the active regions 58, but also covers the active regions 58 as well. Active regions 58 are parallel to each other and the width of each active region 58 is as small as possible. Hence, when the long pass gate 60 is formed over the parallel laid active regions 58, the probability of having stress-induced defects increases, which renders further analysis much easier.

Figure 6:
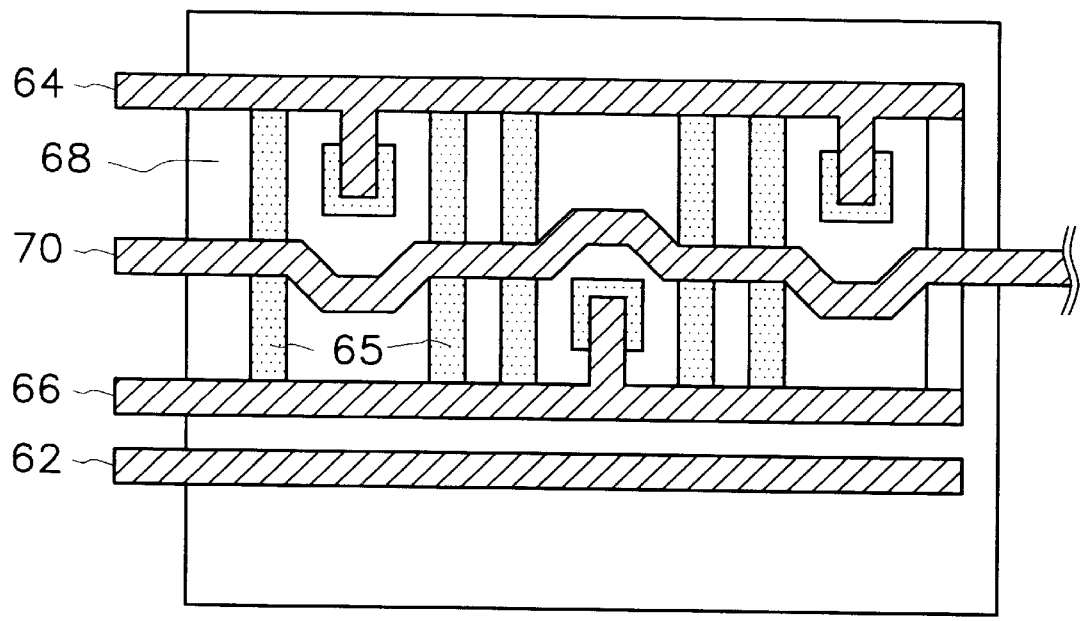
FIG. 6 is an S-shaped long pass gate structure according to this invention.
Figure 7:
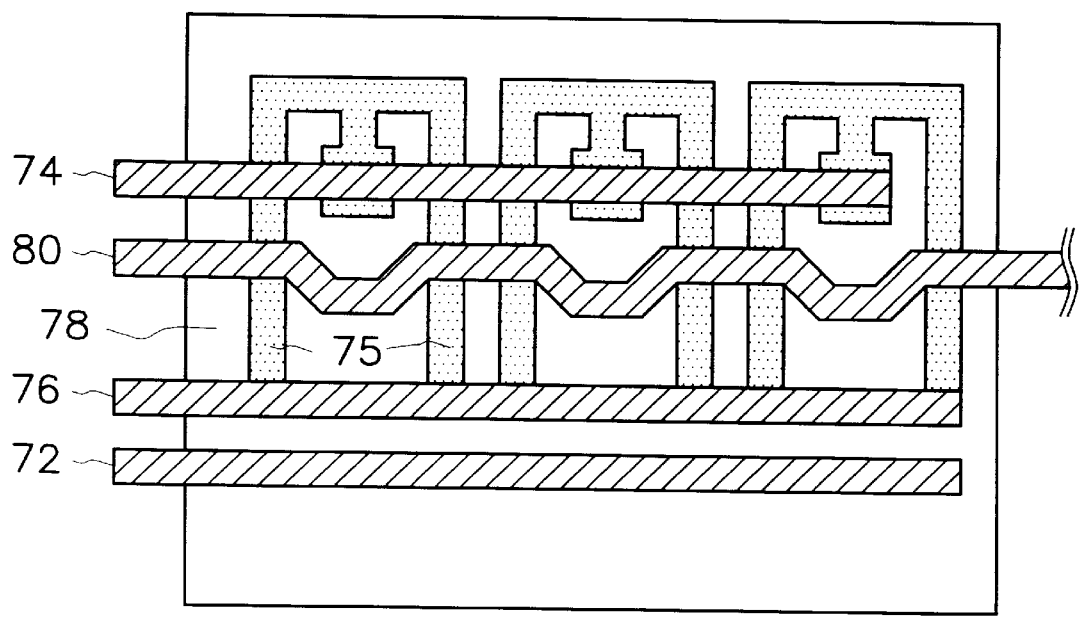
FIG. 7 is a W-shaped long pass gate structure according to this invention.

Furthermore, the smallest possible width for the long pass gate 60 is used so that area occupied by the test keys is reduced. The long pass gate 60 can be designed to have an S-shaped structure as shown in FIG. 6 or a W-shaped structure as shown in FIG. 7. In FIGS. 6 and 7, two of the long pass gate structures that can be used in FIG. 5 are shown. FIG. 6 is an S-shaped long pass gate structure according to this invention. The test key architecture according to FIG. 6 includes a substrate region 62, a source region 66, a drain region 64 and a plurality of active regions 65. A trench isolation region 68 extends between two neighboring active regions 65, and hence is able to prevent device interference. An S-shaped long pass gate 70 runs across and covers the active regions 65.

FIG. 7 is a W-shaped long pass gate structure according to this invention. Similarly, the test key architecture according to FIG. 7 includes a substrate region 72, a source region 76, a drain region 74 and a plurality of active regions 75. There is a trench isolation region 78 between two neighboring active regions 75, and hence able to prevent device interference. A W-shaped long pass gate 80 runs across and covers the active regions 75.

In summary, the active regions are connected in parallel and the smallest possible width is chosen for each the active region; hence the number of parallel active regions is the highest. Therefore, under the action of the trench isolation regions or the long pass gate, probability of leakage current due to parasitic device effect and the probability of stress-induced defect is greatly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a test key architecture on a silicon chip, comprising the steps of:

forming a source region, a drain region and a trench isolation region on the silicon chip, wherein the trench isolation region is located between the source region and the drain region;

forming a plurality of active regions in parallel above the trench isolation region so that one side of each active region is connected to the source region and the other side of the active region is connected to the drain region;

forming a long pass gate above the trench isolation region, crossing and covering over the parallel-connected active regions; and applying a different voltage to each of the source region, the drain region and the long pass gate so that both the effect due to stress-induced defect and parasitic device effect can be measured.

2. The test key architecture of claim 1, wherein the long pass gate has an S-shape.

3. The test key architecture of claim 1, wherein the long pass gate has a W-shape.

4. The test key architecture of claim 1, wherein the smallest possible width for the active region is chosen.

5. The test key architecture of claim 1, wherein the smallest possible width for the long pass gate is chosen.

* * * * *